(12) United States Patent
Ogiwara et al.

(10) Patent No.: US 7,589,513 B2
(45) Date of Patent: Sep. 15, 2009

(54) REFERENCE VOLTAGE GENERATOR CIRCUIT

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 11/783,039

(22) Filed: Apr. 5, 2007

(65) Prior Publication Data

US 2007/0241736 A1  Oct. 18, 2007

(30) Foreign Application Priority Data

Apr. 5, 2006  (JP) .............................. 2006-104077

(51) Int. Cl.
*G05F 3/16* (2006.01)
(52) U.S. Cl. ..................... 323/314; 327/539; 323/316
(58) Field of Classification Search ......... 323/312–316; 327/538–543
See application file for complete search history.

(56) References Cited

U.S. PATENT DOCUMENTS

| | | | |
|---|---|---|---|
| 6,462,612 B1 * | 10/2002 | Roh et al. .................. | 327/539 |
| 6,507,180 B2 * | 1/2003 | Eguchi ....................... | 323/314 |
| 2004/0090826 A1 * | 5/2004 | Ogiwara et al. ......... | 365/189.07 |
| 2005/0237105 A1 * | 10/2005 | Park ........................... | 327/539 |
| 2005/0276140 A1 * | 12/2005 | Ogiwara et al. ............. | 365/212 |

FOREIGN PATENT DOCUMENTS

| | | |
|---|---|---|
| JP | 2005-174435 | 6/2005 |
| JP | 2005-339724 | 12/2005 |
| JP | 2007-141371 | 6/2007 |

OTHER PUBLICATIONS

Ogiwara et al., "Temperature Sensing Circuit, Voltage Generation Circuit, and Semiconductor Storage Device", U.S. Appl. No. 11/599,363, filed Nov. 15, 2006.

* cited by examiner

*Primary Examiner*—Jessica Han
(74) *Attorney, Agent, or Firm*—Finnegan, Henderson, Farabow, Garrett & Dunner, L.L.P.

(57) ABSTRACT

A reference voltage generator circuit comprises a first current path and a second current path. The first current path is formed between an input terminal supplied with a first reference voltage and an output terminal and including a first diode and a first resistor serially connected from the input terminal. The second current path is formed between the input terminal and the output terminal and including a second diode, a second resistor and a third resistor serially connected from the input terminal. A comparator is supplied with a voltage on a node between the first diode and the first resistor and a voltage on a node between the second resistor and the third resistor for comparative amplification. A transistor is connected between the output terminal and a second reference voltage and having a control terminal to receive an output from the first comparator.

11 Claims, 6 Drawing Sheets

REFERENCE VOLTAGE GENERATOR CIRCUIT

CROSS REFERENCE TO RELATED APPLICATION

This application is based on and claims the benefit of priority from prior Japanese Patent Application No. 2006-104077, filed on Apr. 5, 2006, the entire contents of which are incorporated herein by reference.

BACKGROUND OF THE INVENTION

This invention relates to a reference voltage generating circuit used in a semiconductor memory device or the like for generating a reference voltage.

DESCRIPTION OF THE RELATED ART

In a semiconductor memory device, a reference voltage generating circuit for generating a reference voltage is used. A reference voltage is used for generation of voltages applied to a word line or a bit line for example, the reference voltage of a sense amplifier or the like. Generally speaking, a reference voltage generating circuit is formed so that a constant voltage may be generated irrespective of a temperature. However, for example, in a ferroelectric random-access memory, the minimum of a readout voltage distribution concerning memory cells storing data "1", and the maximum of a readout voltage distribution concerning memory cells storing data "0" have a temperature characteristic. For this reason, it is considered to give some temperature characteristic to a reference voltage of a sense amplifier used as the standard for reading data of memory cells.

In a bandgap reference circuit as one of reference voltage generating circuits, it is widely known that a constant reference voltage (for example, a constant voltage of 1.2V) may be generated irrespective of the temperature by adjusting values of the resistors included therein. Alternatively, it is also widely known that it may have temperature characteristic with a positive or negative gradient. Heretofore, a case it has a temperature characteristic with a positive gradient is referred to as "a positive temperature characteristic". A case it has a temperature characteristic with a negative gradient is referred to as "a negative temperature characteristic".

However, in a conventional reference voltage generating circuit, it is impossible to control independently a temperature characteristic (a gradient) and an absolute value of the generated voltage. For example, when trying to obtain a positive temperature characteristic, the absolute value of the generated voltage also becomes larger than 1.2V. It is difficult to obtain a desired voltage value while setting a temperature characteristic at a desired gradient.

Moreover, another reference voltage generating circuit has been proposed in JP 2005-339724A (FIG. 1, paragraphs 0009-0037), for example. In this circuit, after adjusting a reference voltage generating circuit so that it may has a positive temperature characteristic for example, a splitting resistor lowers the absolute value of the generated voltage.

However, in such a circuit, the splitting resistor lowers not only the absolute value of the generated reference voltage but also a gradient of the temperature characteristic. This is regarded as a problem of the circuit. Therefore, it is difficult to generate a reference voltage with a small absolute value and a large positive temperature characteristic.

SUMMARY OF THE INVENTION

In an aspect the present invention provides a reference voltage generator circuit, which comprises a first current path and a second current path. The first current path is formed between an input terminal supplied with a first reference voltage and an output terminal and including a first diode and a first resistor serially connected from the input terminal. The second current path is formed between the input terminal and the output terminal and including a second diode, a second resistor and a third resistor serially connected from the input terminal. The reference voltage generator circuit also comprises a first comparator. The first comparator is supplied with a voltage on a first node between the first diode and the first resistor and a voltage on a second node between the second resistor and the third resistor for comparative amplification. The reference voltage generator circuit also comprises a transistor connected between the output terminal and a second reference voltage and having a control terminal to receive an output from the first comparator.

DETAILED DESCRIPTION OF THE EMBODIMENTS

The embodiments of the present invention will now be described in detail below with reference to the drawings. A reference voltage generator circuit is herein described first as a comparative example and subsequently a reference voltage generator circuit of the present invention is described.

Figure 8:
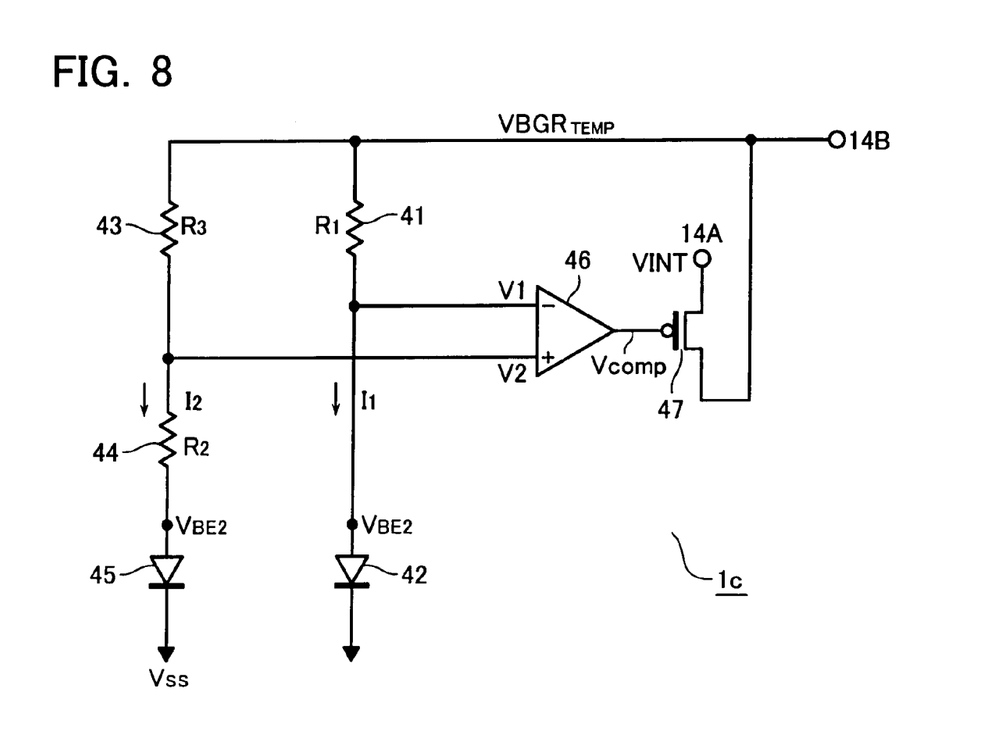
FIG. 8 is a circuit diagram illustrative of an arrangement of a reference voltage generator circuit 1C according to a comparative example.

FIG. 8 shows an arrangement of a reference voltage generator circuit 1C as the comparative example.

The reference voltage generator circuit 1C comprises a first current path. The first current path is formed between an output terminal 14B and the ground potential Vss and including a resistor 41 (a resistance value of $R_1$) and a diode 42 serially connected in this order seen from the output terminal 14B.

The reference voltage generator circuit 1C also comprises a second current path. The second current path is formed between the output terminal 14B and the ground terminal Vss, like the first current path, and including a resistor 43 (a resistance value of $R_3$), a resistor 44 (a resistance value of $R_2$) and a diode 45 serially connected in this order seen from the output terminal 14B. It is assumed herein that the diode 45 has an N-fold are a compared to the diode 42.

The reference voltage generator circuit 1C further comprises an operational amplifier 46, and a p-type MOS transistor 47. The operational amplifier 46 has an on-inverting input terminal connected to a node between the resistors 43 and 44 and an inverting input terminal connected to a node between the resistor 41 and the diode 42. The operational amplifier 46 compares an input voltage V1 on the inverting input terminal with an input voltage V2 on the non-inverting input terminal and controls an output voltage Vcomp such that both input voltages become equal.

The p-type MOS transistor 47 has a gate connected to the output terminal of the operational amplifier 46. The p-type MOS transistor 47 has a source used as an input terminal 14A of the reference voltage generator circuit 1C and supplied with an internal supply voltage VINT (herein set at 1.8V), and a drain connected to the output terminal 14B.

The internal supply voltage VINT is generated from a separate voltage generator circuit (not shown) formed, for example, in a ferroelectric memory.

Figure 1:
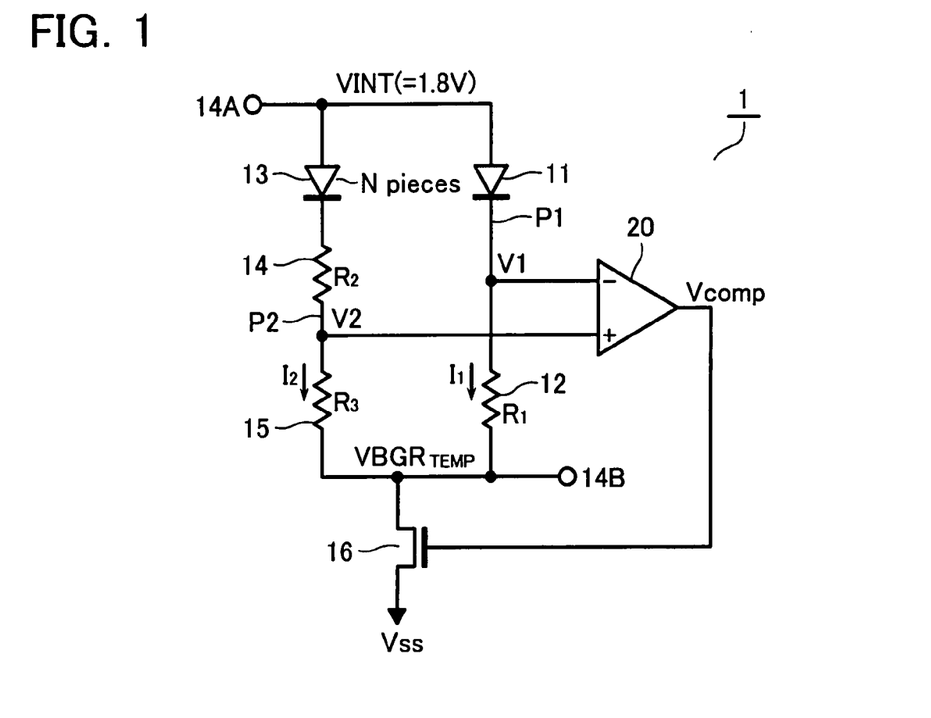
FIG. 1 is a circuit diagram illustrative of an arrangement of a reference voltage generator circuit 1 according to a first embodiment of the present invention.

In FIG. 1, when the current in the first current path and the current in the second current path are denoted with $I_1$ and $I_2$, respectively, then $I_1$ and $I_2$ can be represented by:

$$I_1 = Is \times \exp(q \times Vf1/(k \cdot T))$$

$$I_2 = N \times Is \times \exp(q \times Vf2/(k \cdot T))$$ [Expression 1]

where Is denotes a backward-direction saturation current in the diode 42, 45; Vf1 and Vf2 denote respective forward-direction voltages of the diodes 42, 45; k denotes the Boltzmann constant; T denotes an absolute temperature; and q denotes the charge on an electron.

A replacement of VT=k×T/q yields the following.

$$Vf1 = VT \times \log(I_1/I_S)$$ [Expression 2]

-continued
$$\begin{aligned}Vf2 &= VT \times \log(I_2/(N \cdot I_S)) \\ &= VT \times \log(I_1/(N \cdot I_S) \times R_1/R_3)\end{aligned}$$

In this case, in the reference voltage generator circuit 1C, $I_1 \times R_1 = I_2 \times R_3$ can be established. Therefore, a potential difference dVf applied between both terminals of the resistor 44 (a resistance value of $R_3$) can be represented by:

$$dVf = Vf1 - Vf2 = VT \times \text{Log}(N \times R_3/R_1)$$ [Expression 3]

A potential difference applied between both terminals of the resistor 41 (a resistance value of $R_1$) and resistor 43 (a resistance value of $R_3$) can be represented by $R_3/R_2 \times dVf$. Therefore, the output voltage VBGR from the reference voltage generator circuit 1C can be represented by:

$$\begin{aligned}VBGR &= Vf1 + R_3/R_2 \times dVf \\ &= Vf1 + R_3/R_2 \times VT \times \log(N \times R_3/R_1)\end{aligned}$$ [Expression 4]

Vf1 has a temperature characteristic of −2 [mV/° C.] while VT has a temperature characteristic of +0.086 [mV/° C.]. Accordingly, depending on the selection of the resistances R1, R2, R3, the gradient of the temperature characteristic curve of the output voltage VGBR can be adjusted either positive or negative.

Figure 9:
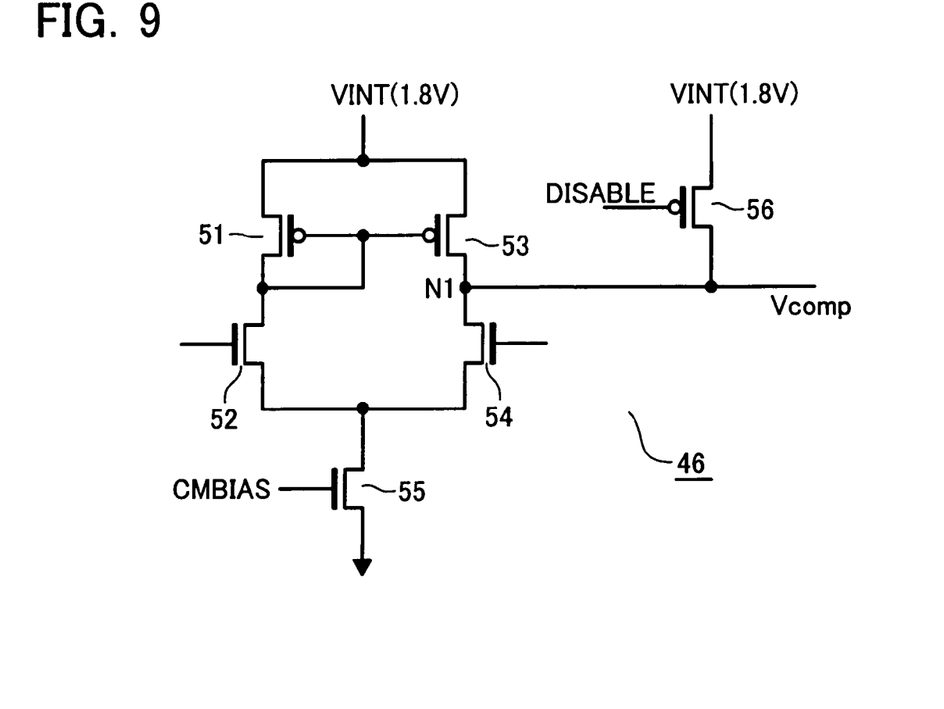
FIG. 9 is a circuit diagram illustrative of an arrangement of an operational amplifier 46 shown in FIG. 8.

An arrangement of the operational amplifier 46 is described with reference to FIG. 9. The operational amplifier 46 comprises a p-type MOS transistor 51, an n-type MOS transistor 52, a p-type MOS transistor 53, and an n-type MOS transistor 54. An n-type MOS transistor 55 is provided to limit the current flowing in the operational amplifier 46. The n-type MOS transistor 55 has a gate supplied with a voltage CMBIAS. This voltage CMBIAS is a voltage with a magnitude that just allows the transistor to turn on, and is generated from a separate circuit, not shown. Thus, the current flowing in the operational amplifier 46 can be suppressed below around 0.1 μm and a lower current can be achieved in the whole circuit.

The p-type MOS transistor 51 and the n-type MOS transistor 52 are serially connected between the internal supply voltage VINT and the n-type MOS transistor 55. The p-type MOS transistor 53 and the n-type MOS transistor 54 also are serially connected between the internal supply voltage VINT and the n-type MOS transistor 55. The p-type MOS transistor 51 is diode-connected. The p-type MOS transistor 51 and the p-type MOS transistor 53 have gates commonly connected. Thus, the p-type MOS transistor 51 and the p-type MOS transistor 53 configure a current mirror circuit. Therefore, an output node N1 (a node between the transistors 53 and 54) provides the output Vcomp after differential amplification of voltages V1, V2 fed to the gates of the n-type MOS transistor 52 and the n-type MOS transistor 54. The output node N1 is connected to an n-type switching MOS transistor 56, which is switched with a disable signal DISABLE for disabling the operational amplifier 46 to provide the output Vcomp after differential amplification.

Figure 10:
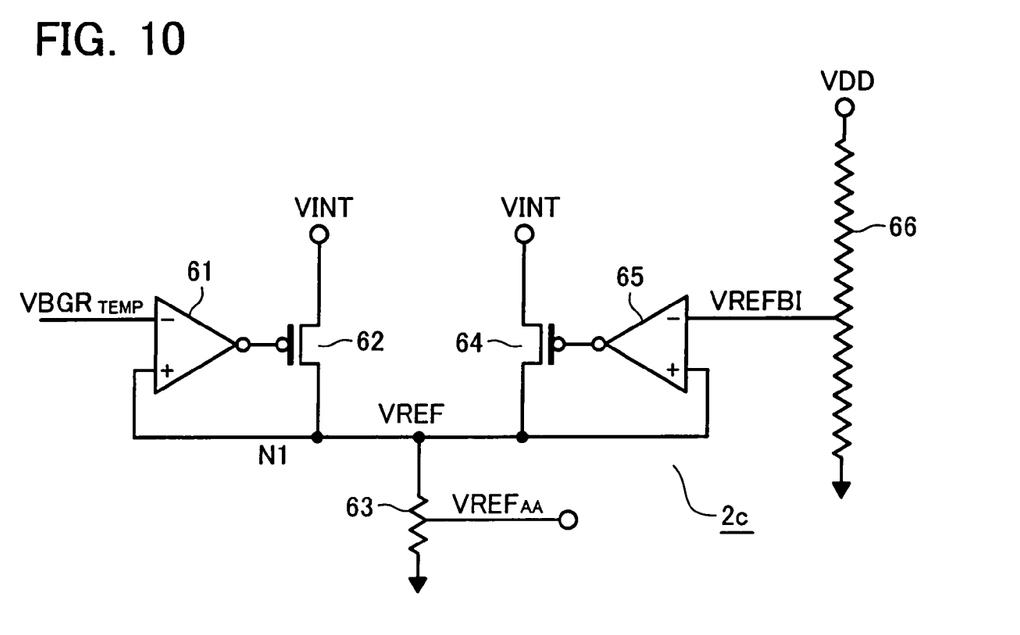
FIG. 10 is a circuit diagram illustrative of an arrangement of a reference voltage circuit 2C configured to receive an output voltage $VBGR_{TEMP}$ from the reference voltage generator circuit 1C of FIG. 8 as an input voltage and operative to provide a reference voltage $VREF_{AA}$.

FIG. 10 shows a reference voltage circuit 2C configured to receive the output voltage $VBGR_{TEMP}$ of FIG. 8 as an input voltage and operative to provide a reference voltage $VREF_{AA}$, which is supplied to a ferroelectric memory cell array. The reference voltage generator circuit 2C in FIG. 10 may be formed independent of the reference voltage generator circuit 1C shown in FIG. 8, for example, on a separate chip. Alternatively, they may be formed integrally on the same chip.

This circuit comprises an operational amplifier 61, a p-type MOS transistor 62, a divider resistor 63, an operational amplifier 64, a p-type MOS transistor 65 and a divider resistor 66.

The operational amplifier 61 has an inverting input terminal to receive the output voltage $VBGR_{TEMP}$ from the circuit of FIG. 8. The operational amplifier 61 has a non-inverting input terminal to receive the output voltage VREF fed back from the node N1 connected to the drain of the p-type MOS transistor 62.

An output resulted from the comparison of the output voltage $VBGR_{TEMP}$ with the output voltage VREF is fed to the gate of the p-type MOS transistor 62 to conduction-control the p-type MOS transistor 62 to controllably set the output voltage VREF at a desired level.

The divider resistor 63 divides the output voltage VREF at a certain division ratio to provide the reference voltage $VREF_{AA}$ to be used, for example, in a memory cell array of a ferroelectric memory.

On the other hand, the operational amplifier 65, the p-type MOS transistor 64 and the divider resistor 66 are configured to provide the reference voltage $VREF_{AA}$, which is provided to a ferroelectric memory cell array as a burn-in voltage for testing, when the external supply voltage VDD exceeds a certain value. The operational amplifier 64 has an inverting input terminal to receive a divided voltage VREFBI of the external supply voltage VDD from the divider resistor 66 (the external supply voltage VDD and the voltage VREFBI have a relation therebetween in accordance with the division ratio). The operational amplifier 64 has a non-inverting input terminal to receive the output voltage VREF fed back from the node N1. If the external supply voltage VDD exceeds a certain value, the reference voltage $VREF_{AA}$ is provided as a burn-in voltage.

Figure 11:
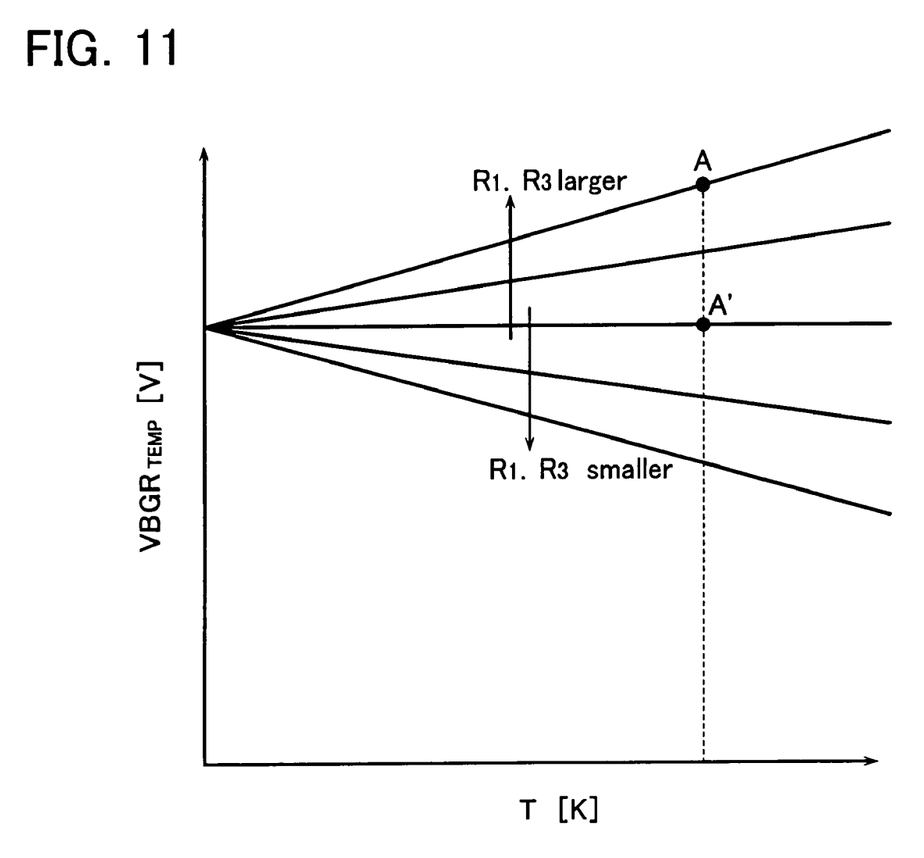
FIG. 11 shows a temperature characteristic of the output voltage from the reference voltage generator circuit 1C according to the comparative example.

As described above, in the reference voltage generator circuit 1 of FIG. 8, depending on the selection of the resistances R1, R2, R3, the gradient of the temperature characteristic curve of the output voltage $VGBR_{TEMP}$ can be adjusted either positive or negative (see FIG. 11). For example, if R1, R3 are made larger than when there is no temperature dependence, the gradient of the temperature characteristic curve can be made positive. In contrast, if R1, R3 are made smaller than when there is no temperature dependence, the gradient of the temperature characteristic curve can be made negative.

In the reference voltage generator circuit 1 of FIG. 8, though, a requirement for a positive temperature characteristic raises the absolute value of the generated reference voltage $VGBR_{TEMP}$ up to the point A from the point A' voltage (FIG. 11) if no temperature dependence exists. If the reference voltage $VGBR_{TEMP}$ at the point A falls outside the operating voltage range, it is not possible to generate any reference voltage that has temperature dependence at the point A. If the absolute value of the voltage at the point A is too large for a reference voltage-supplied target, it can be reduced with a divider resistor or the like. In this case, however, the gradient of the especially obtained desired positive temperature characteristic curve is made smaller in proportion to the division ratio of the divider resistor and may result in an undesired gradient.

First Embodiment

FIG. 1 shows a reference voltage generator circuit 1 according to a first embodiment of the present invention. The reference voltage generator circuit 1 has an input terminal 14A to receive an internal supply voltage VINT (a first voltage: herein set at 1.8 V). Between the input terminal 14A and an output terminal 14B arranged to provide an output voltage $VBGR_{TEMP}$, two current paths P1 and P2 are provided.

The first current path P1 is formed including a diode 11 and a resistor 12 (a resistance value of $R_1$), which are serially connected in this order seen from said input terminal 14A. The second current path P2 is formed including a diode 13, a resistor 14 (a resistance value of $R_2$) and a resistor 15 (a resistance value of $R_3$), which are serially connected from said input terminal 14A.

The diode 13 includes a plurality (N) of parallel-connected diodes each having the same are a as the diode 11. An n-type MOS transistor 16 is connected between the output terminal 14B and the ground potential Vss (a second reference voltage).

The reference voltage generator circuit 1 also comprises an operational amplifier 20 that serves as a comparator. The operational amplifier has an inverting input terminal to receive a voltage V1 on a node between the cathode of the diode and the resistor 12, and a non-inverting input terminal to receive a voltage V2 on a node between the resistor 14 and the resistor 15. An output voltage Vcomp from the operational amplifier 20 after comparative amplification of the voltages V1 and V2 is fed to the gate of the n-type MOS transistor 16. As a result, the transistor 16 is conduction-controlled such that the voltages V1 and V2 become equal and the output voltage $VBGR_{TEMP}$ is adjusted to a desired value.

An arrangement of the operational amplifier 20 is described with reference to FIG. 2. The operational amplifier 20 comprises a p-type, power supplying MOS transistor 21 supplied with a gate voltage CMBPGATE to limit current and having a source connected to the internal supply voltage VINT. The operational amplifier 20 also comprises a p-type MOS transistor 22 and an n-type, diode-connected MOS transistor 23. These transistors are serially connected between the internal supply voltage VINT and the ground potential Vss.

Between the p-type MOS transistor 21 and the ground potential Vss, a p-type MOS transistor 24 and an n-type MOS transistor 25 are serially connected. The p-type MOS transistor 22 has a gate to receive the voltage V1 while the p-type MOS transistor 24 has a gate to receive the voltage V2. The n-type MOS transistor 23 and the n-type MOS transistor 25 have gates commonly connected to configure a current mirror circuit. This arrangement allows the output voltage Vcomp after comparative amplification to be provided as a signal resulted from differential amplification of the input voltages V1 and V2.

Figure 2:
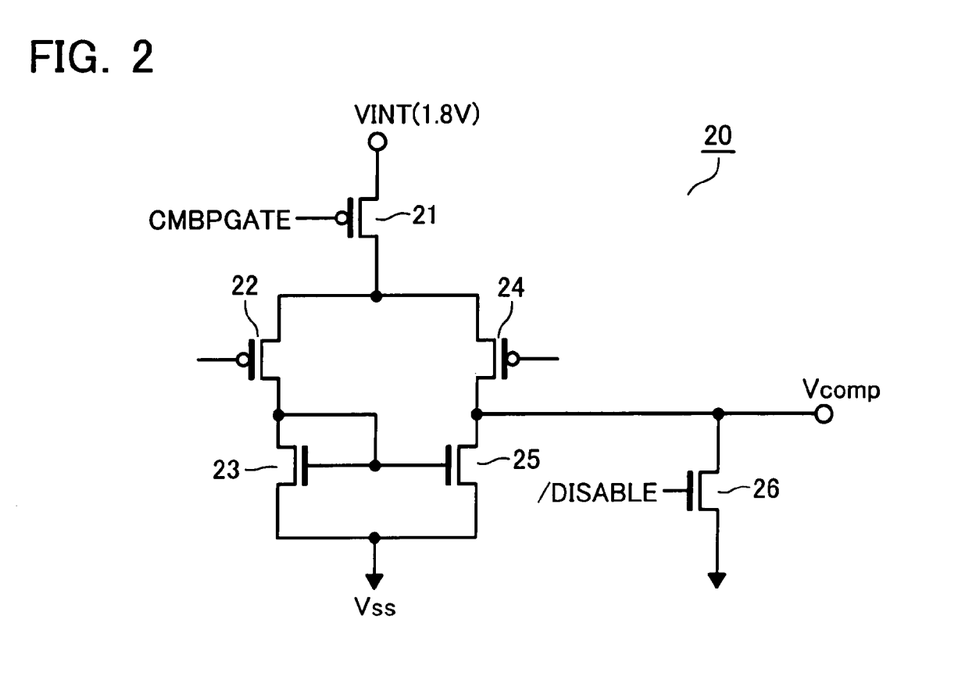
FIG. 2 is a circuit diagram illustrative of an arrangement of an operational amplifier 20 shown in FIG. 1.

In FIG. 2, between the output terminal and the ground potential Vss, an n-type MOS transistor 26 is formed to use a disable signal /DISABLE for disabling the output voltage Vcomp to be provided.

Figure 3:
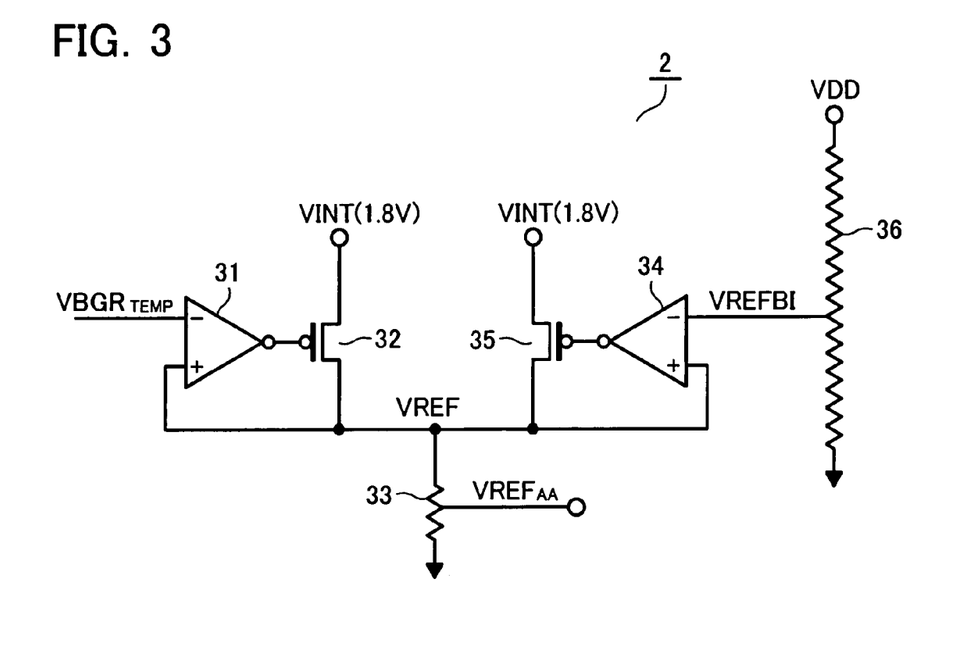
FIG. 3 is a circuit diagram illustrative of an arrangement of a reference voltage circuit 2 configured to receive an output voltage $VBGR_{TEMP}$ from the reference voltage generator circuit 1 of FIG. 1 as an input voltage and operative to provide a reference voltage $VREF_{AA}$.

FIG. 3 is a circuit diagram illustrative of an arrangement of a reference voltage generator circuit 2 configured to receive the output voltage $VBGR_{TEMP}$ of FIG. 1 as an input voltage and operative to provide a reference voltage $VREF_{AA}$, which is supplied to a ferroelectric memory cell array. This reference voltage generator circuit 2 may be formed independent of the reference voltage generator circuit 1 shown in FIG. 1, for example, on a separate chip. Alternatively, they may be formed integrally on the same chip. The reference voltage generator circuit 2 comprises an operational amplifier 31, a p-type MOS transistor 32, a divider resistor 33, an operational amplifier 34, a p-type MOS transistor 35 and a divider resistor 36.

The operational amplifier 31 has an inverting input terminal to receive the output voltage $VBGR_{TEMP}$ from the circuit of FIG. 1 and a non-inverting input terminal to receive the output voltage VREF fed back from the drain of the p-type MOS transistor 32. An output resulted from the comparison of the output voltage $VBGR_{TEMP}$ with the output voltage VREF is fed to the gate of the p-type MOS transistor 32 to conduction-control the p-type MOS transistor 32 to controllably set the output voltage VREF at a desired level. The divider resistor 33 divides the output voltage VREF at a certain division ratio to provide the reference voltage $VBGR_{AA}$ to be used, for example, in a memory cell array of a ferroelectric memory.

On the other hand, the operational amplifier 34, the p-type MOS transistor 35 and the divider resistor 36 are configured to provide a burn-in voltage for testing to a ferroelectric memory cell array. Namely, the operational amplifier 34, the p-type MOS transistor 35 and the divider resistor 36 change the reference voltage $VBGR_{AA}$ to the burn-in voltage when the external supply voltage VDD exceeds a certain value.

The operational amplifier 34 has an inverting input terminal to receive a divided voltage $VREF_{BI}$ of the external supply voltage VDD from the divider resistor 36 (the external supply voltage VDD and the voltage $VREF_{BI}$ have a relation therebetween in accordance with a division ratio of the divider resistor 36). The operational amplifier also has a non-inverting input terminal to receive the output voltage VREF fed back from the drain of the p-type MOS transistor 35. If the external supply voltage VDD exceeds a certain value, the reference voltage $VBGR_{AA}$ is provided as the burn-in voltage.

The output voltage $VBGR_{TEMP}$ from the reference voltage generator circuit 1 of FIG. 1 can be represented by:

$$VBGR_{TEMP} = VINT - \{V1 + R_1/R_2 \times \ln N \times k/q \times T\} \quad \text{[Expression 5]}$$

where T denotes an absolute temperature; q denotes the charge on an electron; and k denotes the Boltzmann constant. [Expression 5] can be modified in the form of $VBGR_{TEMP} = A + B \times T$ (T: Temperature), which yields:

$$A = VINT - V1(0[K])$$

$$B = 0.002 - R_1/R_2 \times \ln N \times k/q \quad \text{[Expression 6]}$$

R1, R2, R3 can be selected appropriately such that the output voltage $VBGR_{TEMP}$ does not depend on temperatures. In this case, $$VINT = 1.8 \text{ V}$$

$$V1 + R_1/R_2 \times \ln N \times k/q \times T = 1.2 \text{ V} \quad \text{[Expression 7]}$$

Figure 4:
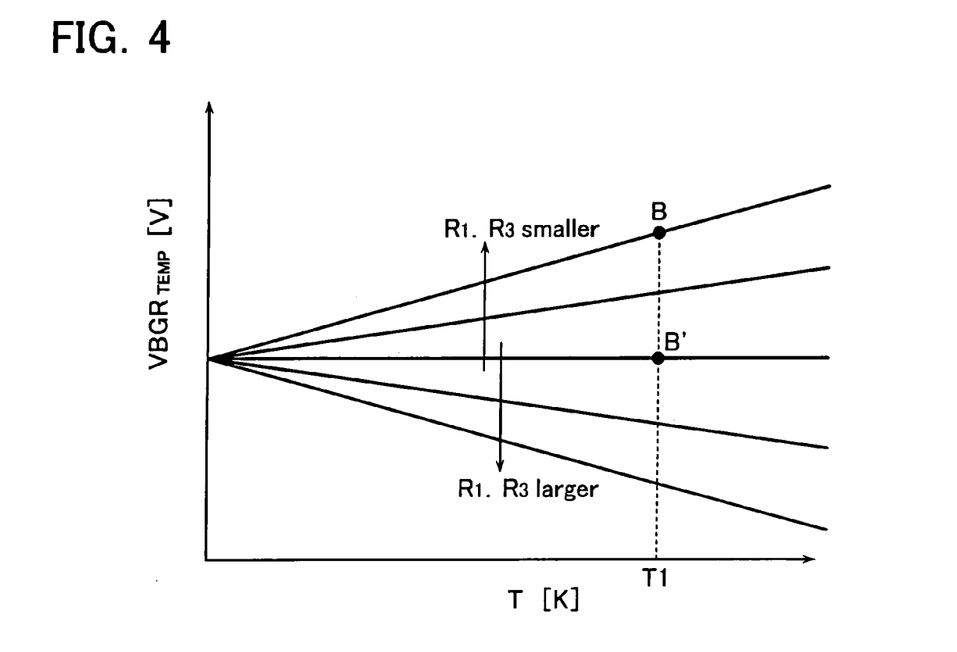
FIG. 4 shows a temperature characteristic of the output voltage from the reference voltage generator circuit 1 of FIG. 1.
Figure 5:
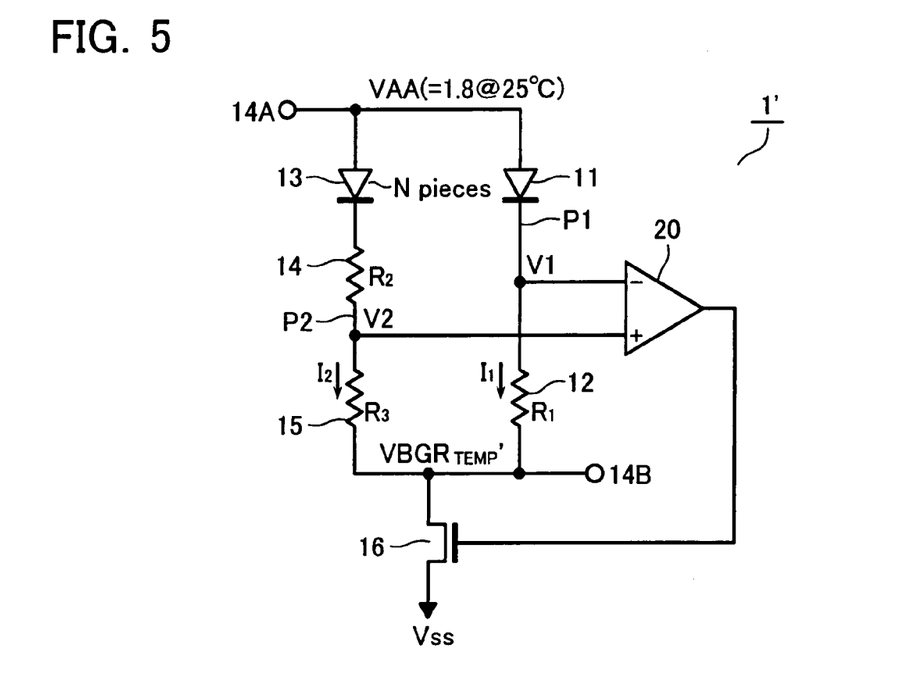
FIG. 5 is a circuit diagram illustrative of an arrangement of a reference voltage generator circuit 1' according to a second embodiment of the present invention.

Accordingly, the following is derived (see FIG. 4).

$$VBGR_{TEMP} = 0.6 \text{ V} \quad \text{[Expression 8]}$$

As R1 and R3 are made smaller than this state, the output voltage $VBGR_{TEMP}$ is given a positive temperature characteristic and the absolute value of the output voltage increases. A smaller variation occurs in the absolute value near the absolute zero degree (0[K]) while a larger variation occurs near room temperature (for example, near T=T1 in FIG. 4).

To the contrary, as R1 and R3 are made larger, the output voltage $VBGR_{TEMP}$ is given a negative temperature characteristic and the absolute value of the output voltage decreases.

A requirement for a positive temperature characteristic raises the absolute value of the generated reference voltage $VGBR_{TEMP}$, like the comparative example (FIG. 11). For example, it is assumed that the resistances are set such that no temperature dependence exists at a temperature T=T1 to cause the voltage (0.6 V) at the point B' in FIG. 4. As R1 and R3 are made smaller than that point to achieve a positive temperature characteristic, a voltage with a larger absolute value arises as that at the point B. In the reference voltage generator circuit 1, however, the reference voltage $VGBR_{TEMP}$ is as low as 0.6 V if no temperature dependence exists (such as the point B'). Therefore, with regard to the voltage also at the point B, the temperature characteristic and the absolute value of the generated voltage are determined based on this 0.6 V characteristic as well. In contrast, in the comparative example (FIG. 8), the temperature characteristic and the absolute value of the generated voltage are determined based on the characteristic of 1.2 V.

The gradient of the temperature characteristic curve at the point B in FIG. 4 and the gradient of the temperature characteristic curve at the point A in FIG. 11 are same while the absolute value of the generated voltage is larger at the point A. The absolute value of the voltage at the point A can also be lowered to a desired value using a divider resistor as well. In this case, however, the gradient of the temperature characteristic curve decreases in accordance with the division ratio. A problem arises because of larger power consumption. Thus, in the reference voltage generator circuit 1C (FIG. 8) as a comparative example, which generates a high voltage when no temperature dependence exists, a positive temperature characteristic may be obtained. However, the gradient of the positive temperature characteristic is made smaller than a desired value after adjusting the voltage to a desired voltage (absolute value).

With this regard, in the reference voltage generator circuit 1 of the present embodiment, the gradient of the temperature characteristic and the absolute value of the generated voltage can be determined based on the 0.6 V characteristic that is lower than the comparative example. Accordingly, it is easy to generate a reference voltage of a smaller absolute value and having a positive temperature characteristic.

Second Embodiment

FIG. 2 shows a reference voltage generator circuit 1' according to a second embodiment of the present invention. The reference voltage generator circuit 1' is almost similar in circuitry itself to that in the first embodiment.

Figure 6:
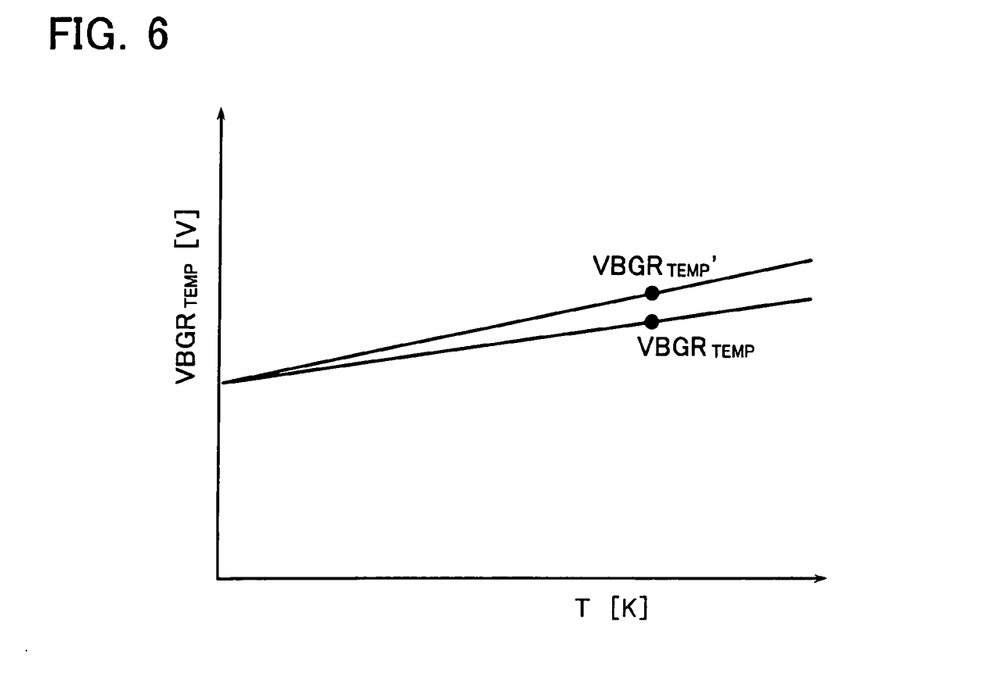
FIG. 6 shows a temperature characteristic of the output voltage from the reference voltage generator circuit 1' of FIG. 5.
Figure 7:
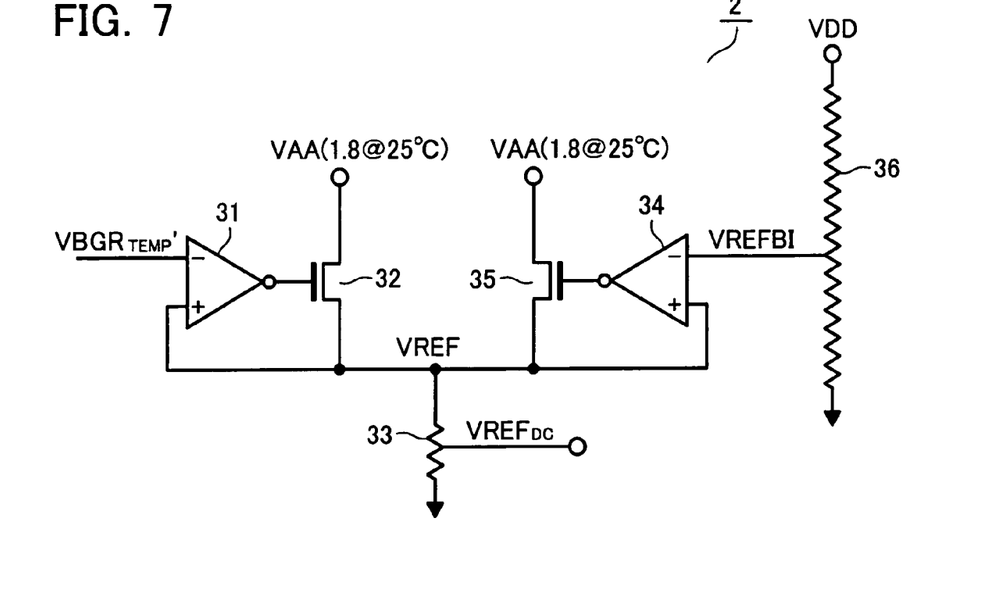
FIG. 7 is a circuit diagram illustrative of an arrangement of a reference voltage circuit 2' configured to receive an output voltage $VBGR_{TEMP}'$ from the reference voltage generator circuit 1 of FIG. 5 as an input voltage and operative to provide a reference voltage $VREF_{DC}$.

The present embodiment differs from the first embodiment in that the input terminal 14A is supplied with an array voltage VAA having a positive temperature characteristic (for example, 1.8 V at 25° C., higher than 1.8 V above 25° C., and lower than 1.8 V below 25° C.) instead of the internal supply voltage VINT having no temperature characteristic. The array voltage VAA is a voltage, for example, supplied to a memory cell array in a ferroelectric memory. The values of the resistors $R_1$, $R_3$ can be adjusted appropriately, like in the first embodiment, to provide a voltage $VBGR_{TEMP}'$ having a more larger positive gradient of the temperature characteristic curve compared to the first embodiment, based on the array voltage VAA having a positive gradient of the temperature characteristic curve (see FIG. 6). The voltage $VBGR_{TEMP}'$ is fed to the reference voltage generator circuit 2' (the transistors 32 and 35 have sources supplied with the array voltage VAA) as shown in FIG. 6, similar to that in FIG. 2, to provide an output voltage $VREF_{DC}$ from the divider resistor 33.

In this embodiment, based on the array voltage VAA having a certain positive temperature characteristic, it is possible to generate an output voltage $VREF_{DC}$ having another temperature characteristic determined from the circuit characteristics of the circuit 1' and the circuit 2'. This embodiment is effective in a requirement for generation of voltages with two different temperature characteristics having a correlation therebetween.

The embodiments of the present invention have been described above though the present invention is not limited to these embodiments but rather can be modified variously without departing from the spirit and scope of the invention.

What is claimed is:

1. A reference voltage generator circuit, comprising:
   a first current path formed between an input terminal supplied with a first reference voltage and an output terminal and including a first diode and a first resistor serially connected from said input terminal;
   a second current path formed between said input terminal and said output terminal and including a second diode, a second resistor and a third resistor serially connected from said input terminal;
   a first comparator supplied with a voltage on a first node between said first diode and said first resistor and a voltage on a second node between said second resistor and said third resistor for comparative amplication; and
   a transistor connected between said output terminal and a second reference voltage and having a control terminal to receive an output from said first comparator.

2. The reference voltage generator circuit according to claim 1, wherein said first reference voltage is a constant voltage ragardless of temperatures.

3. The reference voltage generator circuit according to claim 1, wherein said first reference voltage has a characteristic that exhibits a rise as the temperature elevates.

4. The reference voltage generator circuit according to claim 1, wherein said first comparator is configured to control the output voltage therefrom such that said voltage on said first node and said voltage on said second node become equal.

5. The reference voltage generator circuit according to claim 1, wherein said second diode includes a plurality of parallel-connected diodes each having the same area as said first diode.

6. The reference voltage generator circuit according to claim 1, wherein said first comparator includes
   a first p-type MOS transistor having a gate serving as a first input terminal,
   a second p-type MOS transistor having a gate serving as a second input terminal,
   a first n-type MOS transistor serially connected to said first p-type MOS transistor and diode-connected, and
   a second n-type MOS transistor seriallly connected to said second p-type MOS transistor and having a gate connected to the gate of said first n-type MOS transistor,
   wherein said second p-type MOS transistor and said second n-type MOS transistor have a node therebetween serving as an output terminal.

7. The reference voltage generator circuit according to claim 1, further comprising:
   a second comparator comparing a first output voltage provided from said output terminal with a first voltage to provide a second compared signal;
   a first control transistor having a gate to receive said second compared signal and controllably setting said first voltage at a level in accordance with said second compared signal;
   a third comparator comparing a voltage having a predetermined relation to an external supply voltage with said first voltage to provide a third compared signal;
   a second control transistor having a gate to receive said third compared signal and controllably setting said first voltage at a level in accordance with said third compared signal; and
   an output circuit providing a second output voltage corresponding to said first voltage.

8. The reference voltage generator circuit according to claim 7, wherein said second control transistor controls said first voltage such that said output circuit provides a burn-in voltage for testing a memory cell array when said external supply voltage exceeds a certain value.

9. The reference voltage generator circuit according to claim 7, wherein said first reference voltage has a characteristic that exhibits a rise as the temperature elevates,
   wherein said first output voltage and said second output voltage are provided as voltages with different temperature characteristics having a correlation therebetween.

10. The reference voltage generator circuit according to claim 7, wherein said first comparator is configured to control the output voltage therefrom such that said voltage on said first node and said voltage on said second node become equal.

11. The reference voltage generator circuit according to claim 7, wherein said second diode includes a plurality of parallel-connected diodes each having the same are a as said first diode.

* * * * *